United States Patent
Klein et al.

(10) Patent No.: US 8,158,877 B2
(45) Date of Patent: Apr. 17, 2012

(54) LOCALIZED POWER POINT OPTIMIZER FOR SOLAR CELL INSTALLATIONS

(75) Inventors: David L. Klein, Palo Alto, CA (US); Jan Mark Noworolski, Burlingame, CA (US)

(73) Assignee: SunPower Corporation, San Jose, CA (US)

( * ) Notice: Subject to any disclaimer, the term of this patent is extended or adjusted under 35 U.S.C. 154(b) by 804 days.

(21) Appl. No.: 11/731,455

(22) Filed: Mar. 30, 2007

(65) Prior Publication Data

US 2008/0236648 A1   Oct. 2, 2008

(51) Int. Cl.
*H01L 31/042* (2006.01)
*H01M 10/44* (2006.01)

(52) U.S. Cl. ........... 136/244; 320/101

(58) Field of Classification Search .......... None
See application file for complete search history.

(56) References Cited

U.S. PATENT DOCUMENTS

| | | |
|---|---|---|
| 4,321,418 A | 3/1982 | Dran et al. |
| 4,927,770 A | 5/1990 | Swanson |
| 5,011,544 A | 4/1991 | Gaddy et al. |
| 5,053,083 A | 10/1991 | Sinton |
| 5,100,808 A | 3/1992 | Glenn |
| 5,164,019 A | 11/1992 | Sinton |
| 5,185,042 A | 2/1993 | Ferguson |
| 5,360,990 A | 11/1994 | Swanson |
| 5,369,291 A | 11/1994 | Swanson |
| 5,468,652 A | 11/1995 | Gee |
| 5,660,646 A | 8/1997 | Kataoka et al. |
| 5,972,732 A | 10/1999 | Gee et al. |
| 6,274,402 B1 | 8/2001 | Verlinden et al. |
| 6,313,395 B1 | 11/2001 | Crane et al. |
| 6,315,575 B1 | 11/2001 | Kajimoto |
| 6,333,457 B1 | 12/2001 | Mulligan et al. |
| 6,337,283 B1 | 1/2002 | Verlinden et al. |
| 6,387,726 B1 | 5/2002 | Verlinden et al. |
| 6,423,568 B1 | 7/2002 | Verlinden et al. |
| 6,734,656 B2 | 5/2004 | Miller et al. |
| 7,148,774 B1 | 12/2006 | Shea et al. |
| 7,154,361 B2 | 12/2006 | Babu et al. |

(Continued)

FOREIGN PATENT DOCUMENTS

JP   2000112545 A  *  4/2000

(Continued)

OTHER PUBLICATIONS

W.P. Mulligan, et al., "A Flat-Plate Concentrator: Micro-Concentrator Design Overview", 2000, 3 sheets; Proceedings of the 28th IEEE PVSC.

(Continued)

*Primary Examiner* — Jessica L Ward
*Assistant Examiner* — Steven Ha
(74) *Attorney, Agent, or Firm* — Okamoto & Benedicto LLP

(57) ABSTRACT

In one embodiment, a solar cell installation includes several groups of solar cells. Each group of solar cells has a local power point optimizer configured to control power generation of the group. The local power point optimizer may be configured to determine an optimum operating condition for a corresponding group of solar cells. The local power point optimizer may adjust the operating condition of the group to the optimum operating condition by modulating a transistor, such as by pulse width modulation, to electrically connect and disconnect the group from the installation. The local power point optimizer may be used in conjunction with a global maximum power point tracking module.

14 Claims, 6 Drawing Sheets

U.S. PATENT DOCUMENTS

| | | | |
|---|---|---|---|
| 7,161,105 | B2 | 1/2007 | Sabisch |
| 7,514,900 | B2 * | 4/2009 | Sander et al. ............ 320/101 |
| 2002/0059952 | A1 | 5/2002 | Shimada |
| 2003/0029036 | A1 | 2/2003 | Gerson |
| 2004/0040593 | A1 | 3/2004 | Ho et al. |
| 2004/0211459 | A1 | 10/2004 | Suenaga et al. |
| 2005/0105224 | A1 | 5/2005 | Nishi |
| 2005/0252546 | A1 | 11/2005 | Sasaki |
| 2006/0085167 | A1 | 4/2006 | Warfield et al. |
| 2006/0170400 | A1 | 8/2006 | Pai |
| 2007/0228838 | A1 * | 10/2007 | Delmerico et al. ........ 307/84 |

FOREIGN PATENT DOCUMENTS

WO     WO 2006005125 A1 *    1/2006

OTHER PUBLICATIONS

Keith R. McIntosh, et al., "The Choice of Silicon Wafer for the Production of Low-Cost Rear-Contact Solar Cells", May 2003, 4 sheets; Sunnyvale, California.

P.J. Verlinden, et al., "Will We Have a 20%-Efficient (PTC) Photovoltaic System?", 2001, 6 sheets; Proceedings of the 17$^{th}$ Europe Photovoltaic Solar Energy Conference.

William P. Mulligan, et al., "Development of Chip-Size Silicon Solar Cells", 2000, 6 sheets; Proceedings of the 28$^{th}$ IEEE PVSC.

Akira Terao, et al., "A Mirror-Less Design for Micro-Concentrator Modules", 2000, 4 sheets; Proceedings of the 28$^{th}$ IEEE PVSC.

P.J. Verlinden, et al., "Backside-Contact Silicon Solar Cells with Improved Efficiency for the '96 World Solar Challenge", 1997, 5 sheets; Proceedings of the 15$^{th}$ EPSEC.

P.J. Verlinden, et al., "One-Year Comparison of a Concentrator Module with Silicon Point-Contact Solar Cell to a Fixed Flat Plate Module in Nothern California", 2000, 4 sheets; Proceedings of the 16$^{th}$ EPSEC.

Richard M. Swanson, "The Promise of Concentrators", 2000, pp. 93-111, Progress in Photovoltaics: Research and Applications.

"Flipper Turbot Build Sheet", [retrieved on Apr. 25, 2007], 4 pages, Retrieved from the internet website <http://www.jwgoerlich. solarbnotics/flipper/build_sheet.htm>., illustrating work completed in Oct. 2003.

"Flipper" [retrieved on Apr. 25, 2007], 1 pg., Retrieved from the internet website <http://jwgoerlich.solarbotics.net/robots/flipper/default.htm>., illustrating work completed in Oct. 2003.

D.M.Considine, ED., "Van Nostrand's Scientific Encyclopedia", New York: Van Nostrand Reinhold, 1989, p. 1096.

C.W. Paul, "Hot-Melt Adhesives", MRS Bulletin, Jun. 2003, pp. 440-444.

Archive.org website, "The Glue Store—Adhesives 101", retrieved on Apr. 27, 2007, 6 pages, [Retrieved from the internet: <http://www.glue-store.com/adhesives101.html>.

Archive.org website, "CSE Distributors PVC Tape", retieved on Apr. 25, 2007, 2 pages, [Retrieved from the internet: <http://www.csedistributors.com/acatalog/PVC_Tape.html>.

Trishan Esram and Patrick L. Chapman, "Comparison of Photovoltaic Array Maximum Power Point Tracking Techniques", 11 sheets, [retrieved on Feb. 28, 2007] [Retrieved from the internet: <http://energy.ece.uiuc.edu/chapman/papers/EC%202006%20in%20press.pdf>.

Richard A. Cullen, "Maximum Power Point Tracking", pp. 1-5, [retrieved on Feb. 24, 2007] [Retrieved from the internet: <http://www.earthtoys.com/emagazine.php?issue_number=03.02.01&article=power_point_tracking>.

Wind&Sun Electricity From The Sun, Maximum Power Point Tracking, pp. 1-7, [retrieved on Feb. 24, 2007] [Retrieved from the internet: <http://www.wind-sun.com/Charge_Controls_Meters/PPT.htm>.

PCT International Search Report for Application No. PCT/US08/03867, 2 sheets, Jun. 17, 2009.

* cited by examiner

LOCALIZED POWER POINT OPTIMIZER FOR SOLAR CELL INSTALLATIONS

BACKGROUND OF THE INVENTION

1. Field of the Invention

The present invention relates generally to solar cells, and more particularly but not exclusively to solar cell installations.

2. Description of the Background Art

Solar cells are well known devices for converting solar radiation to electrical energy. They may be fabricated on a semiconductor wafer using semiconductor processing technology. Generally speaking, a solar cell may be fabricated by forming P-type and N-type diffusion regions in a silicon substrate. Solar radiation impinging on the solar cell creates electrons and holes that migrate to the diffusion regions, thereby creating voltage differentials between the diffusion regions. In a back-junction solar cell, both the diffusion regions and the metal grids coupled to them are on the back side of the solar cell. The metal grids allow an external electrical circuit to be coupled to and be powered by the solar cell.

A solar cell installation, such as that shown in FIG. 1, typically includes a plurality of solar cells that are strung together to generate power delivered to a load, such as an inverter. In FIG. 1, the installation includes a solar cell module 100 that comprises a plurality of solar cell strings 104, each with a set of solar cells 102 and a diode D1. The installation may include more than one solar cell module. A maximum power point tracking and regulator module 103 optimizes the power delivered to the load on a global basis for the entire installation regardless of the number of solar cell modules employed.

Each set of solar cells 102 may comprise a plurality of solar cells arranged in serial fashion. Each diode D1 allows for removal of a string 104 from the installation in the event the string 104 is faulty or drags down the overall power generation capability of the installation. During normal operation, a substring 104 generates power such that it has the polarity shown in FIG. 1. In that case, the diode D1 is reversed bias and has no electrical influence on the installation. In the event of a failure, a string 104 changes polarity such that its corresponding diode D1 is forward biased, thereby shunting off that string 104 from the installation.

Although the installation of FIG. 1 and similar installations provide much needed renewable energy source, techniques for improving their power generation capability would make them more economically viable for widespread use.

SUMMARY

In one embodiment, a solar cell installation includes several groups of solar cells. Each group of solar cells has a local power point optimizer configured to control power generation of the group. The local power point optimizer may be configured to determine an optimum operating condition for a corresponding group of solar cells. The local power point optimizer may adjust the operating condition of the group to the optimum operating condition by modulating a transistor, such as by pulse width modulation, to electrically connect and disconnect the group from the installation. The local power point optimizer may be used in conjunction with a global maximum power point tracking module.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
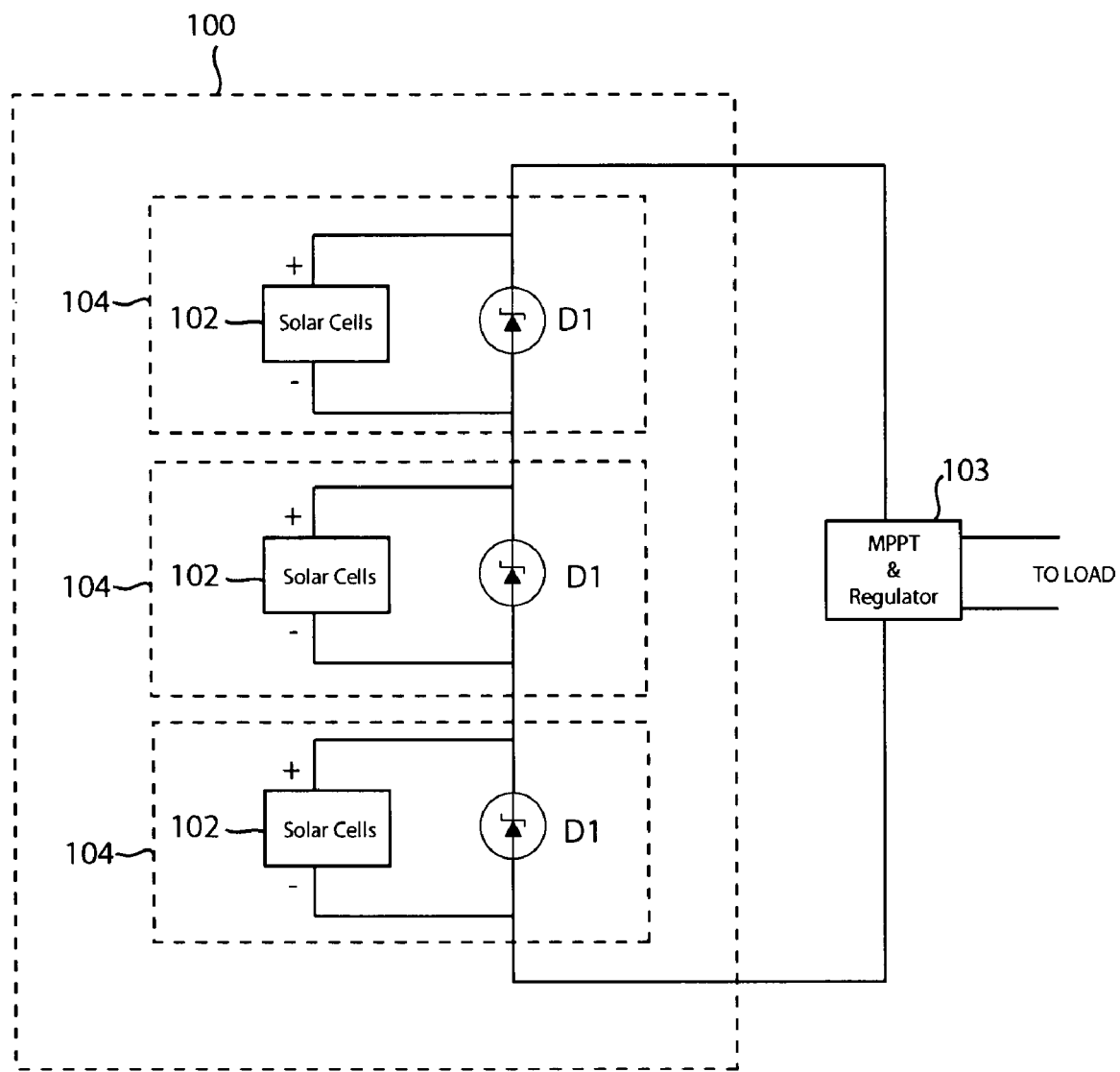
FIG. 1 schematically shows a conventional solar cell installation.
Figure 2:
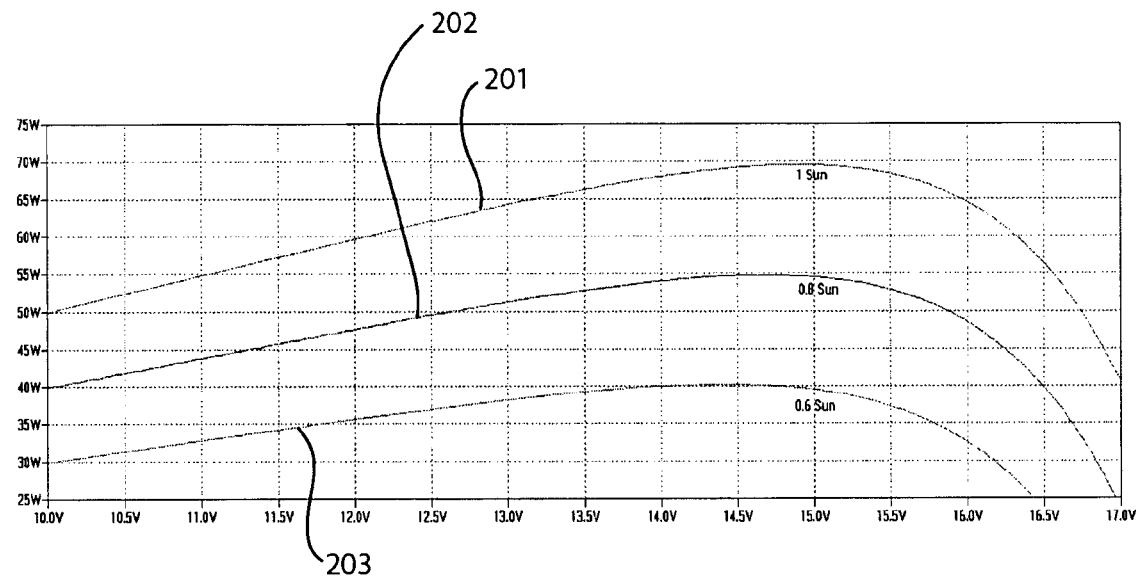
FIG. 2 shows a simulated response of a single string of solar cells operating at various illumination levels.

FIG. 2 shows a simulated response of a single string of twenty four solar cells operating at various illumination levels. In FIG. 2, the vertical and horizontal axes represent the power and voltage outputs of the string, respectively. Plot 201 shows the response of the string at 1 sun of insolation. Plot 202 is for 0.8 sun of insolation and plot 203 is for 0.6 sun of insolation. The less than 1 sun of insolation in plots 202 and 203 may be attributable to dirt, clouds, shadows, etc. that block the sun from fully illuminating all of the solar cells in the string.

An installation, which in this case comprises a single string, is typically biased to generate a particular output voltage and current (i.e., power). The biasing point is also referred to herein as "operating condition." It can be seen from FIG. 2 that there is a particular bias point, referred to as "maximum power point," where the installation generates maximum output power. The power generated by the installation diminishes beyond the maximum power point.

Figure 3:
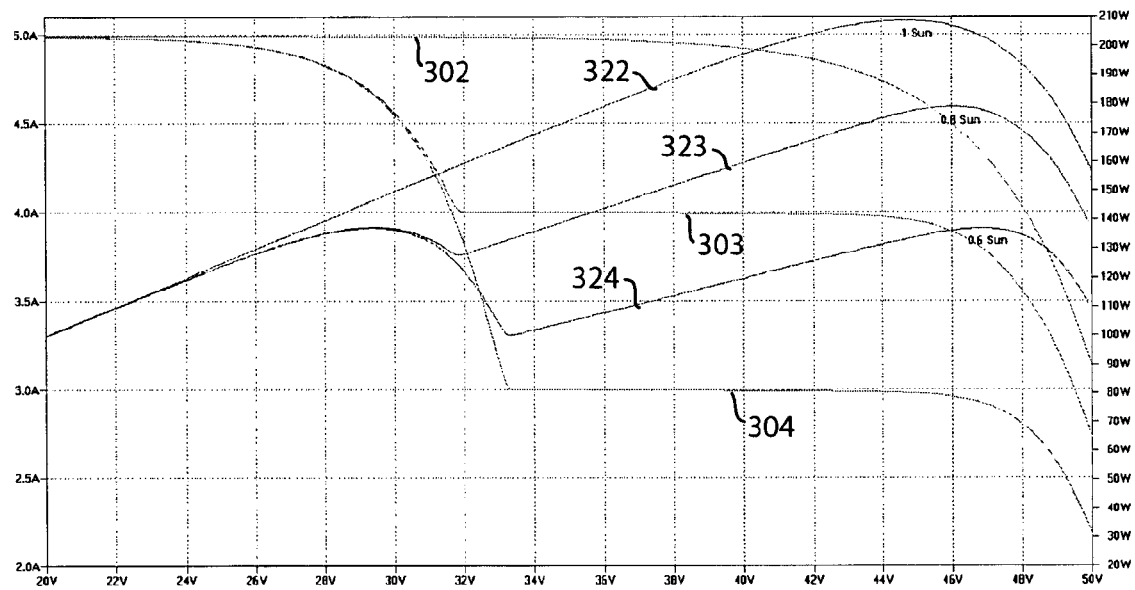
FIG. 3 shows a simulated response of three separate strings connected in series, with one string having various illumination levels.

FIG. 3 shows a simulated response of three separate strings connected in series, with each string having twenty four solar cells. In FIG. 3, the horizontal axis represents output voltage. The left vertical axis represents output current and goes with plots 302-304, while the right vertical axis represent output power and goes with plots 322-324. In plots 302 and 322, all three strings have the same 100% insolation. In plots 303 and 323, two strings have 100% insolation and one string has 80% insolation. In plots 304 and 324, two strings have 100% insolation and one string has 60% insolation.

Comparing FIGS. 2 and 3, note that a decrease in solar radiation on a single string on a three-string installation (FIG. 3) impacts the overall output power significantly more than in a single string installation (FIG. 2). In the case of plots 303 and 323 where one string is illuminated with 80% sunlight (i.e., 0.8 sun) and the other two strings in full sunlight (i.e., 1 sun), the installation could provide 195 Watts but was providing only 179 Watts. This constitutes a 16 Watt loss in performance. The performance difference becomes more pronounced with more severe illumination reduction.

The present invention addresses these problems associated with partial illumination and solar cell performance variations in general by providing localized power point optimization. A local power point optimizer may be configured to manage power generation in each group of solar cells in an installation with several groups of solar cells such that the entire installation delivers optimum amount of power to the load. Embodiments of the present invention are now described beginning with FIG. 4. It is to be noted that while the following embodiments describe buck conversion, other approaches, such as boost conversion, linear (continuous) shunting techniques, and AC power conversion, may also be used without detracting from the merits of the present invention.

Figure 4:
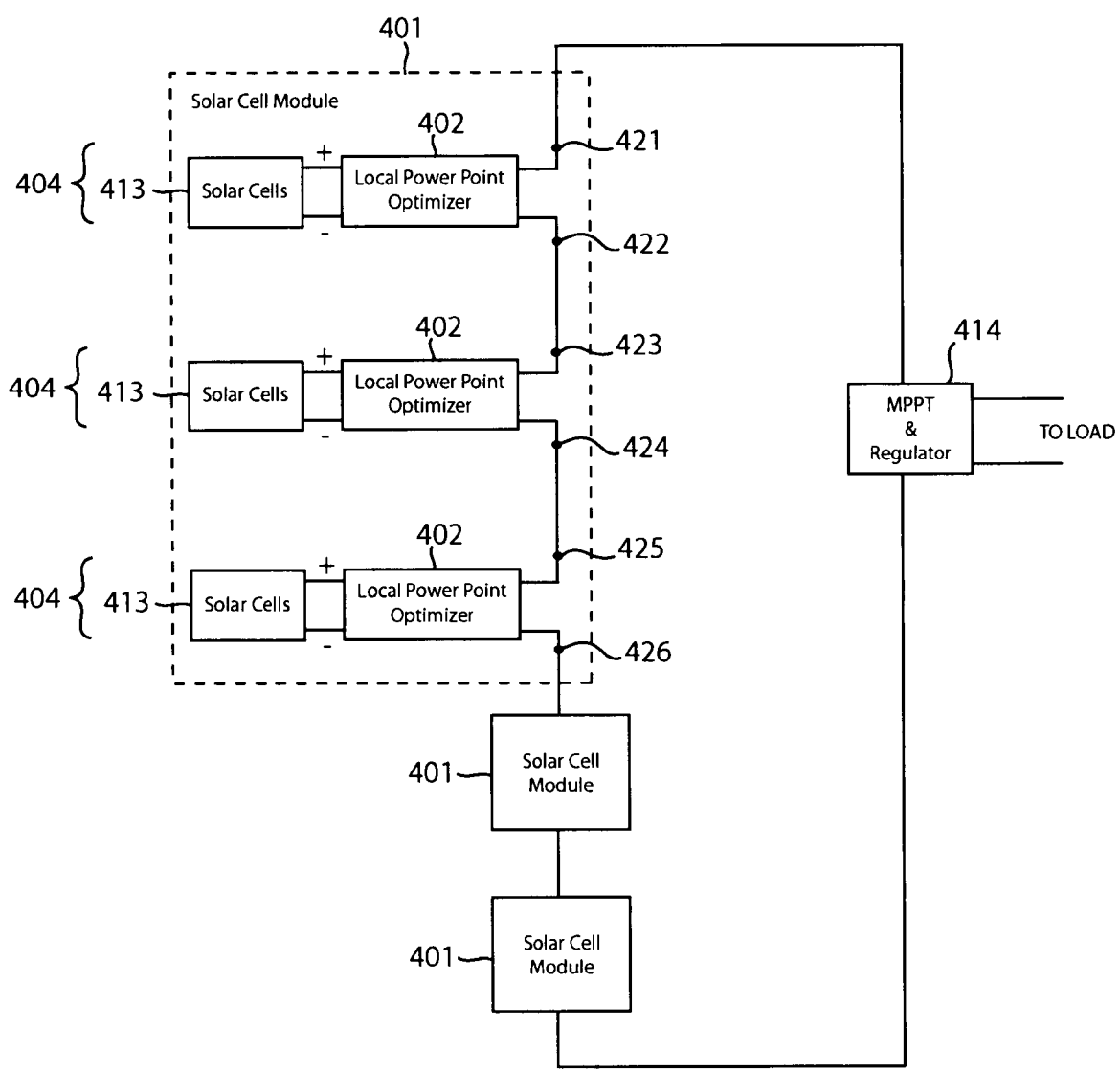
FIG. 4 schematically shows a solar cell installation in accordance with an embodiment of the present invention.

FIG. 4 schematically shows a solar cell installation in accordance with an embodiment of the present invention. In the example of FIG. 4, the installation includes one or more solar cell modules (also referred to as a "panel") 401. Each solar cell module 401 may include a plurality of solar cells 413, each of which may comprise a back-junction solar cell. The solar cells 413 may be connected in series to form a string. In the example of FIG. 4, a string 404 includes a group of serially connected solar cells 413 and a local power point optimizer 402.

A local power point optimizer 402 may comprise an electrical circuit configured to optimize the power contribution of a group of solar cells to a solar cell installation with several groups of solar cells. A local power point optimizer 402 may be configured to load a string of solar cells 413 at the point of maximum power delivery (i.e., maximum power point). Nodes 421-426 are shown in FIG. 4 for reference as to how a local power point optimizer 402 may be included in an installation.

The installation of FIG. 4 also includes a maximum power point tracking (MPPT) and regulator module 414. The module 414 may comprise a commercially-available MPPT module for providing a global maximum power point tracking for the entire installation. The module 414 may be connected to an inverter of a residential home, commercial structure, or industrial facility, for example. As will be more apparent below, localized power point optimization in conjunction with global maximum power point tracking advantageously improves the performance of a solar cell installation.

Figure 5:
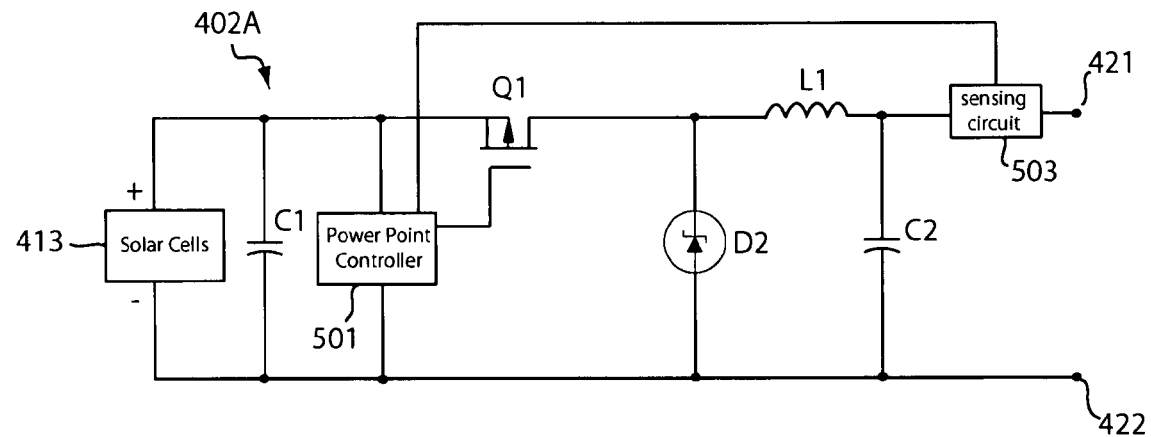
FIGS. 5-8 schematically show a group of serially connected solar cells being used in conjunction with a local power point optimizer in accordance with embodiments of the present invention.

FIG. 5 schematically shows a group of serially connected solar cells 413 being used in conjunction with a local power point optimizer 402A in accordance with an embodiment of the present invention. Local power point optimizer 402A is a particular embodiment of the local power point optimizer 402 shown in FIG. 4. The local power point optimizer 402A may be serially connected to the installation of FIG. 4 by way of nodes 421 and 422, for example.

In one embodiment, the local power point optimizer 402A comprises an electrical circuit configured to control the amount of power contributed by the serially connected solar cells 413 to the overall installation of solar cells. In the example of FIG. 5, the local power point optimizer 402A comprises a power point controller 501, a P-channel metal oxide semiconductor field effect transistor (PFET) Q1, an output stage comprising an inductor L1 and capacitor C2, a power reserve capacitor C1, a diode D2, and a sensing circuit 503. The sensing circuit 503 may comprise a resistor, comparator, or other circuit arrangement or component configured to sense the current and voltage output of the string 404.

The power point controller 501 may comprise electrical circuit configured to monitor the voltage and current output of the string 404 by way of the sensing circuit 503, determine the maximum power point of the string, and control the switching of the transistor Q1 to adjust the bias point of the string to the determined maximum power point. The power point controller 501 may employ conventional maximum power point tracking algorithm, such as the Hill-climbing or RCC algorithm, to track, and thereby determine, the maximum power point of the string.

In the example of FIG. 5, the power point controller 501 loads the solar cells 413 to adjust the bias point of the string to the maximum power point. In one embodiment, the power point controller 501 does so by adjusting the duty cycle of a pulse width modulated signal used to control the switching of the PFET Q1. Turning ON the PFET Q1 electrically connects the solar cells 413 to the rest of the solar cell installation. Conversely, turning OFF the PFET Q1 electrically disconnects the solar cells 413 from the rest of the solar cell installation.

The power point controller 501 may be implemented using a microcontroller to perform maximum power point tracking and a buck regulator to control the loading of the string to adjust its power point to the maximum power point, for example. The power point controller 501 may switch ON the PFET Q1 in situations where the solar cells 413 can generate voltage and/or current at the maximum power point, and switch OFF the PFET Q1 in situations where the solar cells 413 cannot generate voltage and/or current at the maximum power point. The reserve capacitor C1 stores charge from the solar cells 413 when the PFET Q1 is OFF and discharges when the PFET Q1 is ON. This allows the solar cells 413 together with charge stored in the reserve capacitor C1 to deliver maximum power in situations where the solar cells 413 by themselves could not. The reserve capacitor C1 thus advantageously increases the time when the solar cells 413 can be connected and thus contributes power to the installation.

As a particular example, assuming the load (e.g., inverter) requests 5 amps but the string can only provide a maximum of 4 amps due to a cloud cover or other reasons, the power point controller 501 will adjust the switching of the PFET Q1 such that approximately 1 amp of current passes through the diode D2, bypassing the string. The net impact of this is that the string would still be providing the installation 4 amps, its maximum power point at that time, instead of being in a low-power generate state at higher current.

The diode D2 provides a current path through the string when the PFET transistor is switched OFF. The diode D2 also serves as a safety measure for shunting the solar cells 413 OFF the installation when the solar cells 413 reverse polarity, such as during very low power generation or failure. The diode D2 is reversed biased, and therefore does not affect the operation of the string during normal operation, in that case.

The inductor L1 and capacitor C2 form an output stage for filtering the output of the string so that it provides a steady, rather than rapidly changing, voltage. It is to be noted that the inductor L1 and capacitor C2 are not needed in every string. To save cost and for improved efficiency, the inductor L1 and capacitor C2 may be limited to some, but not all, of the strings 404 of the installation of FIG. 4. Depending on the application, the inductor L1 and capacitor C2 may also be omitted entirely from the installation.

Suitable values for a 5 Amp circuit are about 1 milli Farad for capacitors C1 and C2 and 10 micro Henry for inductor L1. The capacitors C1 and C2 preferably have a high ripple current capability (e.g., >5 A) and low ESR. The inductor L1 preferably has low resistance and able to handle current greater than 6 Amps. The PFET Q1 preferably has as low ON resistance as possible (e.g., STP80 PF55 transistor from ST Microelectronics; 0.016 Ohms ON resistance). A suitable diode D2 includes the 80SQ045 diode from International Rectifier. The switching period of the PFET Q1 may be optimized based on selected components, but 10-100 kHz may be suitable depending on the application.

Figure 6:
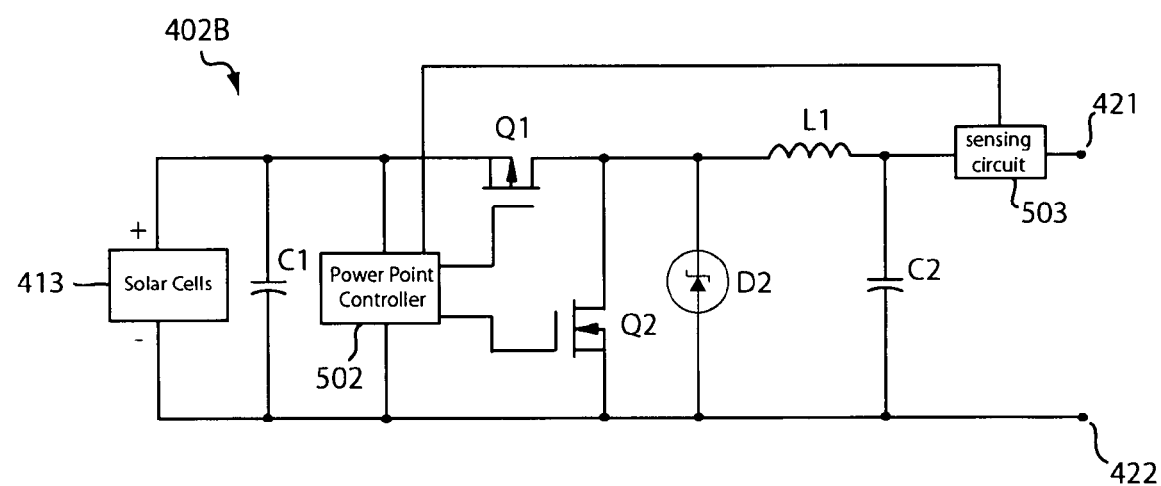

FIG. 6 schematically shows a group of serially connected solar cells 413 being used in conjunction with a local power point optimizer 402B in accordance with another embodiment of the present invention. Local power point optimizer 402B is a particular embodiment of the local power point optimizer 402 shown in FIG. 4.

The local power point optimizer 402B is the same as the local power point optimizer 402A of FIG. 5 except for the addition of an N-channel metal oxide semiconductor field effect transistor (NFET) Q2. The NFET Q2 provides a low loss (compared to the diode D2) current path through the string when the PFET Q1 is OFF. The power point controllers 501 and 502 are the same except that the power point controller 502 synchronously switches the transistors Q1 and Q2, i.e., PFET Q1 is ON when NFET Q2 is OFF and vice versa. The diode D2 is an optional safety measure in the local power point optimizer 402B. The diode D2 may be omitted in some applications. The components and operation of the power point optimizers 402B and 402A are otherwise the same.

The local power point optimizer 402A has fewer components, and is thus cheaper to manufacture, than the local power point optimizer 402B. However, the local power point optimizer 402B is preferable in applications requiring higher efficiency. A limitation of both local power point optimizers 402A and 402B is that a P-channel MOSFET, such as PFET Q1, has a minimum resistance of about 0.02 Ohm when ON. This means that about 0.5 Watt is wasted by the inefficiency of the PFET. A higher cost but higher performance alternative is to use an NFET as a high side switch. However, employing an NFET as a high side switch would require a voltage source that is higher in voltage than the output voltage of some solar cell strings. This necessitates the use of an additional voltage source, such as a voltage source 702 shown in FIGS. 7 and 8.

Figure 7:
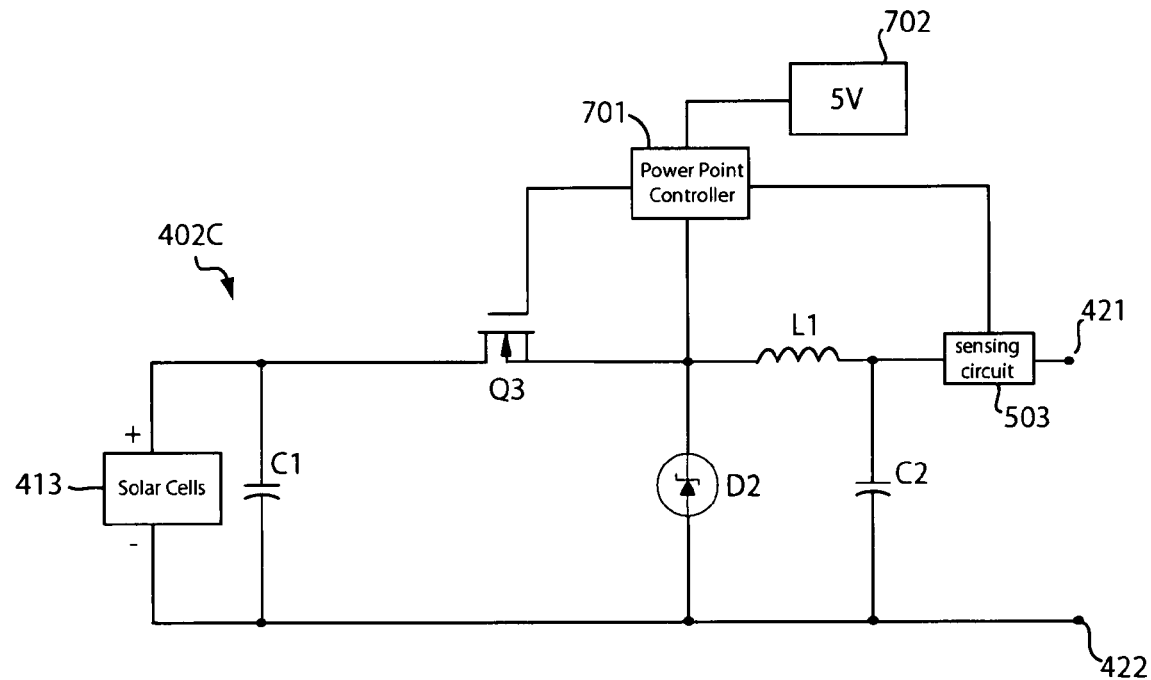

FIG. 7 schematically shows a group of serially connected solar cells 413 being used in conjunction with a local power point optimizer 402C in accordance with another embodiment of the present invention. Local power point optimizer 402C is a particular embodiment of the local power point optimizer 402 shown in FIG. 4.

The local power point optimizer 402C is the same as the local power point optimizer 402A of FIG. 5 except for the use of an NFET Q3, rather than a PFET Q1. The NFET Q3 is coupled to a voltage source 702, which allows for enough gate voltage to switch ON the NFET Q3. In one embodiment, the voltage source 702 provides approximately 5V. The voltage source 702 may be other strings in the solar cell installation, a voltage converter circuit (e.g., charge pump), a designated solar cell in a solar cell module, etc. The power point controllers 501 and 701 are the same except that the power point controller 701 provides additional voltage to the NFET Q3 to switch it ON. The components and operation of the local power point optimizers 402A and 402C are otherwise the same.

Figure 8:
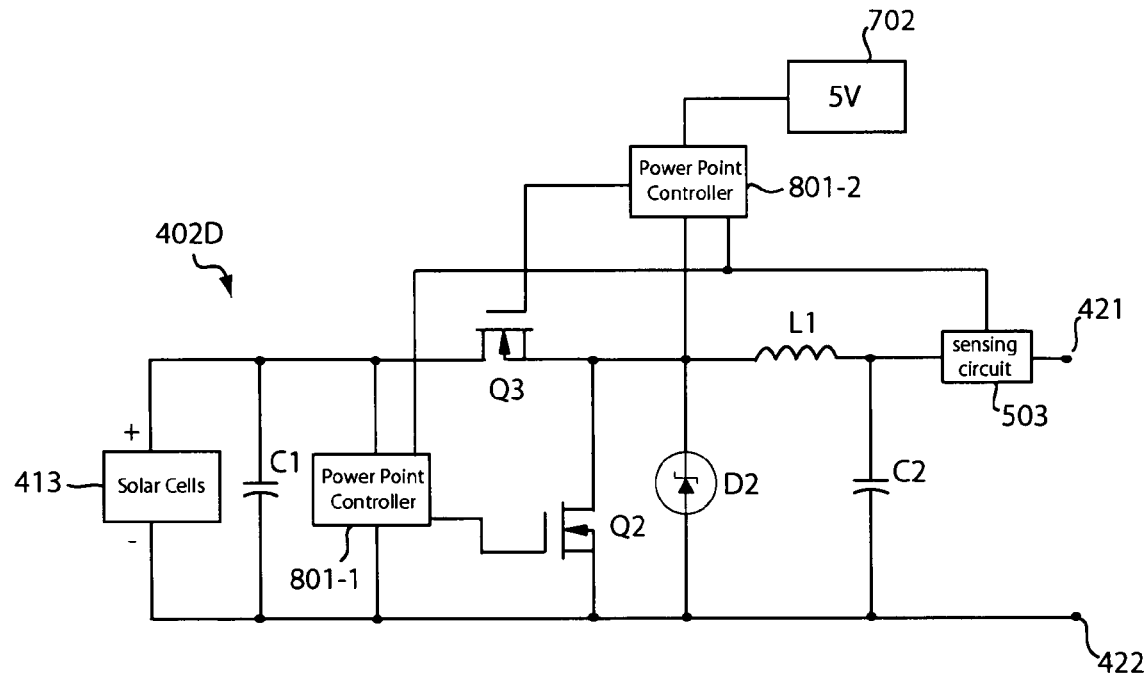

The local power point optimizer 402D shown in FIG. 8 is a synchronous version of the local power point optimizer 402C. A power point controller 801, which is shown in two parts as controllers 801-1 and 801-2, synchronously controls the NFET Q3 and NFET Q2 to adjust the bias point of the string as before. A voltage source 702 allows the power point controller 801 to apply enough voltage on the gate of the NFET Q3 to turn it ON.

The power point controller 801 operates the same way as the power point controller 501 except that the power point controller 801 synchronously controls an NFET Q3 and an NFET Q2. The NFET Q3 is switched OFF when the NFET Q2 is ON and vice versa. Like in the local power point optimizer 402B of FIG. 6, the NFET Q2 provides a low loss current path (compared to the diode D2) when the NFET Q3 is OFF. The diode D2 is an optional safety measure in the local power point optimizer 402D. The diode D2 may be omitted in some applications. The components and operation of the power point optimizers 402D and 402A are otherwise the same. Suitable values for the local power point optimizer 402D for a 5A circuit are shown in Table 1.

TABLE 1

| Component | Value | Loss information | Part # |
|---|---|---|---|
| C1 | 3900 uF, 25 V | 16 mOhms @ 20 C | UPW1E392MHH Nichicon |
| C2 | 1000 uF, 25 V | 32 mOhms @ 20 C | UPW1E102MPD Nichicon |
| Q3 | IRF6678 | 3 mOhms, Qg = 43nC | International Rectifier |
| Q2 | FDS6690ACT | 12 mOhms, Qg = 9nC | Fairchild Semiconductor Synchronous FET |
| L1 | ~60–120 uH | | Micrometals T130-53 or similar |

Figure 9:
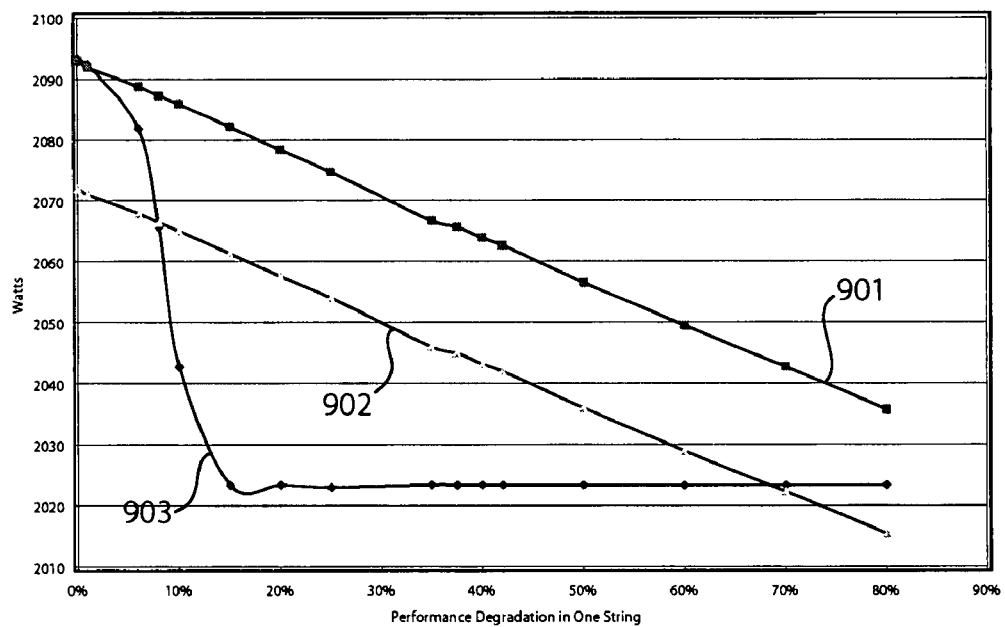
FIGS. 9 and 10 show simulated responses illustrating predicted performance of embodiments of the present invention.

FIG. 9 shows a simulated response of a test solar cell module with 30 strings, each string having twenty four solar cells. The vertical axis represents the maximum power output of the test module in Watts, while the horizontal axis represents the performance degradation of a single string in percent. In FIG. 9, plot 903 is the response of the test module when using a single global maximum power point tracking for all 30 strings, with one of the strings being degraded. Plot 902 is the response of the test module when using a single global maximum power point tracking for all 30 strings, with one of the strings being degraded, and a local power point optimizer 402B (see FIG. 6) for each of the strings. Plot 902 assumes 99% efficient local power point optimizers 402B. Plot 901 is the same as plot 902 in the ideal case, which is 100% efficient local power point optimizers 402B.

As can be seen in FIG. 9, for a single string degradation in excess of approximately 8%, a conventional maximum power point tracking approach (plot 903) does not recover the maximum power available from the test module. In fact, when the individual string has a reduction in performance in excess of approximately 15%, the conventional approach utilizes the overall test module at a bias point where the degraded string provides zero power. In contrast, local power point optimization (plots 902 and 901) ensures that all strings in the test module always provide power to the load, independent of how degraded their performance might be relative to others. As a point of reference, 100% efficient local power point optimization (plot 901), the ideal case, ensures that the safety diodes (e.g., diodes D2) are never forward biased.

Figure 10:
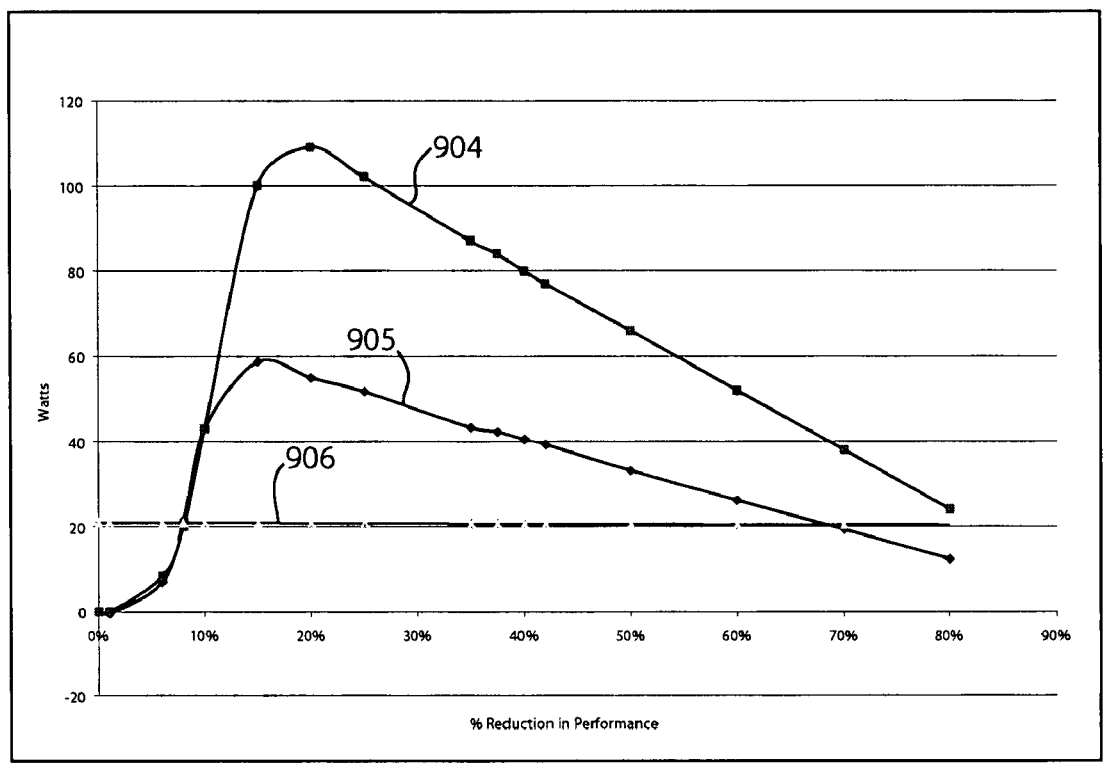

FIG. 10 shows a simulated response of the test solar cell module with 30 strings, each string having twenty four solar cells. The vertical axis represents the recoverable power of the test module in Watts, while the horizontal axis represents the performance degradation of two strings in percent. In FIG. 9, plot 906 is the response of the test module when using a single global maximum power point tracking for all 30 strings, with two of the strings being degraded. Plot 905 is the response of the test module when using a single global maximum power point tracking for all 30 strings, with two of the strings being degraded, and a local power point optimizer 402B for each of the strings. Plot 905 assumes 99% efficient local power point optimizers 402B. Plot 904 is the same as plot 905 in the ideal case, which is 100% efficient local power point optimizers 402B.

As can be seen from FIG. 10, for performance reduction of 20% in two of the thirty strings in the test module, 99% efficient local power point optimization (plot 905) can extract 90 W (110 W−20 W) more from the test module compared to the conventional approach (plot 906).

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A solar cell installation comprising:
    a plurality of groups of solar cells, the plurality of groups of solar cells being serially interconnected to generate an overall output power to a load;
    a separate local power point optimizer for each group of solar cells in the plurality of groups of solar cells and serially interconnects a corresponding group of solar cells to other groups of solar cells in the plurality of groups of solar cells, the local power point optimizer including a power point controller configured to modulate a first transistor to electrically connect and disconnect the corresponding group of solar cells to the installation to adjust a bias point of the corresponding group of solar cells to deliver maximum power as determined by the local power point optimizer; and
    a maximum power point tracking module configured to adjust an operating point of the plurality of groups of solar cells to maximize the overall output power to the load as determined by the maximum power point tracking module;
    wherein the separate local power point optimizer for each group of solar cells in the plurality of groups of solar cells further comprises an output stage at the output of the separate local power point optimizer, the output stage being configured to filter a voltage output of the corresponding group of solar cells.

2. The solar cell installation of claim 1 wherein the local power point optimizer synchronously controls the first transistor and a second transistor to adjust the bias point of the corresponding group of solar cells, the second transistor providing a current path through the corresponding group of solar cells when the first transistor is switched OFF.

3. The solar cell installation of claim 2 wherein the first transistor comprises a PFET and the second transistor comprises an NFET.

4. The solar cell installation of claim 1 wherein the output stage comprises an inductor having a first end and a second end and a capacitor having a first end and a second end, the first end of the inductor being coupled to the first transistor, the second end of the inductor being coupled to a first end of the capacitor, the second end of the capacitor being coupled to another local power point optimizer of another group of solar cells in the plurality of solar cells.

5. The solar cell installation of claim 1 wherein the first transistor comprises a PFET.

6. The solar cell installation of claim 1 wherein the first transistor comprises an NFET.

7. The solar cell installation of claim 6 further comprising a voltage source configured to provide additional voltage to a gate of the first transistor to allow the first transistor to be switched ON.

8. The solar cell installation of claim 1 further comprising a diode across the corresponding group of solar cells, the diode being configured to be reversed bias during normal operation of the corresponding group of solar cells.

9. The solar cell installation of claim 1 further comprising a capacitor configured to be charged by the corresponding group of solar cells when the first transistor is switched OFF.

10. A solar cell installation comprising:
    a plurality of serially interconnected groups of solar cells;
    an electrical circuit in each group of solar cells in the plurality of serially interconnected groups of solar cells, the electrical circuit serially interconnecting a corresponding group of solar cells to other groups of solar cells in the plurality of serially interconnected groups of solar cells, the electrical circuit being configured to determine an operating condition of the corresponding group of solar cells where the corresponding group of solar cells generates a target power output and to adjust the corresponding group of solar cells to operate at the determined operating condition, the electrical circuit in each group of solar cells in the plurality of serially interconnected groups of solar cells further comprising an output filter stage, the output filter stage comprising an inductor at the output of the electrical circuit.

11. The solar cell installation of claim 10 wherein the electrical circuit modulates a first transistor to electrically connect and disconnect the corresponding group of solar cells from the installation such that the corresponding group of solar cells generates the target power output.

12. The solar cell installation of claim 11 wherein the electrical circuit synchronously switches the first transistor and a second transistor to electrically connect and disconnect the corresponding group of solar cells from the installation such that the corresponding group of solar cells generates the target power output.

13. The solar cell installation of claim 12 wherein the first transistor comprises a PFET and the second transistor comprises an NFET.

14. The solar cell installation of claim 11 wherein the first transistor comprises an NFET.

* * * * *